United States Patent [19]

Koblinger et al.

[11] Patent Number: 5,109,267
[45] Date of Patent: Apr. 28, 1992

[54] METHOD FOR PRODUCING AN INTEGRATED CIRCUIT STRUCTURE WITH A DENSE MULTILAYER METALLIZATION PATTERN

[75] Inventors: Otto Koblinger, Korntal-Munchingen; Hans-Joachim Trumpp, Filderstadt, both of Fed. Rep. of Germany

[73] Assignee: International Business Machines Corporation, Armonk, N.Y.

[21] Appl. No.: 731,695

[22] Filed: Jul. 17, 1991

[30] Foreign Application Priority Data

Oct. 26, 1990 [EP] European Pat. Off. ........ 90120587.2

[51] Int. Cl.⁵ ...................... H01L 29/34; H01L 21/44
[52] U.S. Cl. ......................................... 357/54; 357/52; 357/71; 437/198; 437/235; 437/978; 437/985
[58] Field of Search ........................... 357/52, 54, 71; 437/198, 235, 978, 985

[56] References Cited

U.S. PATENT DOCUMENTS 5,060,050  10/1991  Tsuneoka et al. ................ 357/54

Primary Examiner—Edward J. Wojciechowicz
Attorney, Agent, or Firm—William D. Sabo

[57] ABSTRACT

Disclosed is a method for manufacturing a high-denisty multilayer metallization pattern on an integrated circuit structure. Also disclosed are integrated circuit structures made with such method. The components of the integrated circuit may be formed on the substrate using conventional processes. A first metallization pattern is then formed on the semiconductor substrate having at least one integrated circuit. Next, the first layer of a double-layer insulation is applied over the first metallization pattern, and a photoresist layer is applied over the first layer for planarizing the topology of the metallization pattern and for defining a pad mask by a photoprocess over a conductive pad. For planarization of the topology, the photoresist layer and the first layer of the double-layer insulation are reactive ion etched at substantially the same rate to a desired depth. This reactive ion etching step also removes the first layer of the double-layer insulation from the pad mask area thereby exposing a metal pad. On top of the planarized topology, the second layer of the double-layer insulation is applied, and vias are opened in the layer by a plurality of dry-etching steps. The second metalliation pattern is formed on this second layer. Then, another double-layer insulation is applied on top of the second metallization pattern, the first layer being an inorganic and the second layer an organic layer. After opening vias in the layers of this double-layer insulation by contour-etching, a third metallization pattern is applied. Optionally, a fourth metallization pattern can be formed on the integrated circuit structure.

19 Claims, 4 Drawing Sheets

METHOD FOR PRODUCING AN INTEGRATED CIRCUIT STRUCTURE WITH A DENSE MULTILAYER METALLIZATION PATTERN

BACKGROUND OF THE INVENTION

1. Field of the Invention

This invention relates to a method for producing integrated circuits having conductor-insulator layers formed thereon; and, more specifically, to a method for producing a dense multilayer metallization pattern on integrated circuits. The invention also relates to an integrated circuit structure with a dense multilayer metallization pattern made with such method.

2. Description of the Prior Art

Integrated circuits are well known devices which provide complicated circuit structures on a single chip. These devices have grown more and more complicated with increasing numbers of devices required for new applications. One technique to meet these requirements is to increase the size of the chips. Another technique is to shrink the size of the individual components of the integrated circuit. Each of these techniques has its problems; and as known techniques for increasing the density of integrated circuits have approached theoretical limits, new methods for increasing the density and complexity of integrated circuits have been sought. One response to these demands is to turn to multilayer interconnection structures in order to afford greater flexibility in arranging the devices on the semiconductor substrates.

One known multilayer interconnection technique is to deposit a first layer of interconnecting metallization on the integrated circuit. Next, an insulating layer is deposited over the first metallization layer. In some cases, the integrated circuit is planarized to a certain extent by the addition of an auxiliary layer of a photoresist and etching the photoresist and the insulating dielectric layer at substantially the same rate to planarize the device (see A.C. Adams, et al., "*Planarization of Phosphorus-Doped Silicon Dioxide*", J. Electrochem. Soc., Vol. 128, No. 2 (1981), pp. 423 to 429).

Another method which also uses an organic auxiliary layer and a back etching step is disclosed in DE-OS 33 45 040 A1. This method uses as the planarizing layer a polyimide layer which is applied to a metallization pattern on an insulating surface. The entire surface of the polyimide layer is etched back by dry etching to such a depth that the metallization pattern is exposed. Following this step, an inorganic insulating layer is deposited having the desired thickness.

A still improved planarization method is described in EP-A-87106561.1 A1 (0 244 848). According to this method, a metallization pattern is passivated by an inorganic insulating layer, which is conformal with the metallization pattern on the substrate. Next, an organic auxiliary layer is applied to obtain a planar surface. The organic auxiliary layer and the underlying inorganic insulating layer are etched at the same etch rate in a magnetron dry-etching apparatus for a time during which the organic auxiliary layer is completely removed. Next, a second series of inorganic insulating layer and organic auxiliary is applied and etched. This process is surface of the inorganic insulating layer has been achieved.

SUMMARY OF THE INVENTION

Accordingly, it is an object of the present invention to provide a reliable method for producing a high-density multilayer metallization pattern on an integrated circuit substrate.

The method of the present invention is especially suitable for the manufacture of high performance VLSI integrated circuits, e.g. integrated CMOS devices. The invention also comprises integrated circuit structures made in accordance with the method of the invention. In accordance with the method of the present invention, the components of the integrated circuit may be formed on the substrate using conventional processes. A first metallization pattern is then formed on the semiconductor substrate having at least one integrated circuit. Next, the first layer of a double-layer insulation is applied over the first metallization pattern, and a photoresist layer is applied over the first layer for planarizing the topology of the metallization pattern and for defining a pad mask by a photoprocess over a conductive pad. For planarization of the topology, the photoresist layer and the first layer of the double-layer insulation are reactive ion etched at substantially the same rate to a desired depth. This reactive ion etching (RIE) step also removes the first layer of the double-layer insulation from the pad mask area thereby exposing the metal pad over the conductive pad. On top of the planarized topology, the second layer of the double-layer insulation is applied, and vias are opened in the second layer by a plurality of dry-etching steps. The second metallization pattern is formed on this second layer. Then, another double-layer insulation is applied on top of the second metallization pattern, the first layer being an inorganic and the second an organic layer. After opening vias in the layers of this double-layer insulation, a third metallization pattern is applied. Optionally, a fourth metallization pattern can be formed on the integrated circuit structure.

As mentioned above, the multilayer metallization patterns made in accordance with the invention are especially suitable for deposition on integrated CMOS devices. The CMOS process for making integrated complementary metal oxide semiconductor (CMOS) devices generally comprises a plurality of process features, such as forming and filling trenches, forming an N- or P-well, recessed oxide and polysilicon gate, and implanting source/drain. The implantation is followed by forming metal silicide on the source and drain regions, and on the polysilicon gate. The formation of a silicon nitride barrier layer, the deposition of borophosphorsilicate glass (BPSG) as an insulating layer, and contact hole etching complete the front end of the line of the CMOS process.

The back end of the line of this process generally relates to the forming of a multilayer metallization pattern, such as in accordance with the method of the present invention. In CMOS devices which employ field or insulating oxides between the individual devices, the metallization patterns deposited over oxide areas and over device diffusions are at different levels. This level offset has to be corrected, because otherwise it would be very difficult to deposit any further interconnecting metallization layers on the device, and because vias on higher levels etch wider than vias on lower levels.

The compensation of the level offset is achieved in accordance with the method of the present invention, with a planarizing pad via mask which is formed over the first layer of a double-layer insulation. In a reactive ion etching step, the topology created by the first metallization pattern is corrected, and, at the same time, the metal pad areas which are difficult to planarize are opened.

After the planarization of the first layer and after the deposition of the second layer of the double-layer insulation, a second planarizing reactive ion etching process may be introduced. This process, which involves the application of a second photoresist layer and the back-etching of the photoresist layer and the second layer of the double-layer insulation, further improves planarity and prevents void formation in the plasma deposited second layer of the double-layer insulation.

A further important feature of the method of the present invention is the forming of double-layer insulations for separating the first and second metallization patterns or the second and third metallization patterns, respectively. The double-layer insulation between the first and second metallization patterns preferably comprises plasma-deposited silicon nitride and plasma-deposited silicon dioxide with RIE planarization of the plasma-deposited nitride. The double-layer insulation between the second and third metallization patterns preferably comprises plasma-deposited silicon nitride and polyimide.

In general, the thickness of the first double-layer insulation is about 1 $\mu$m, while the thickness of the second double-layer insulatin is < about 2 $\mu$m. Also, generally speaking, the thickness of the first and second metallization patterns are < about 1 $\mu$m, and the thickness of the third metallization pattern is < about 1 $\mu$m.

Yet, a further important feature of the method of the present invention is that small metal pitches can be defined. Pitch is here defined as the sum of the width of the metal line and its separation from an adjacent line as seen in a plan view. Lift-off techniques have been used to define the small metal pitches. Generally, the metal pitches of the first and the second metallizations are < about 3 $\mu$m, and the metal pitch of the third metallization is > about 3 $\mu$m.

The foregoing and other objects, features and advantages of the invention will be apparent from the following more particular description of the preferred embodiments of the invention.

DESCRIPTION OF THE PREFERRED EMBODIMENTS

Figure 1:
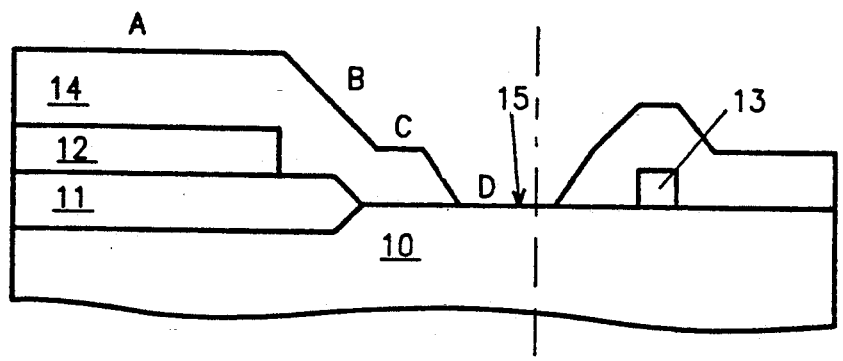
FIG. 1 is a cross-section of an integrated CMOS device showing the layer sequence on a substrate body and a sloped contact hole to the substrate prior to the deposition of the first metallization layer (front end of the line of CMOS process)

FIG. 1 shows a cross-section of a CMOS integrated circuit structure on which according to the method of the invention a multilayer metallization pattern of high density separated by layers of insulating material will be generated. The structure consists of the following: A substrate 10 of p-type silicon; a semi-recessed, thermally grown oxide (SROX) 11; doped polysilicon 12, 13 applied by chemical vapor deposition under low pressure and determining interconnect lines 12 for the connection to other parts of the integrated circuit and gate 13; borophosphorsilicate glass (BPSG) insulation 14; and a contact hole 15 for making electrical contact of the first level of metallization with an active region, e.g. source/drain (not shown), in the substrate. The contact holes 15 are defined by a photoprocess using a high-precision stepper and by contour-etching in an RIE process. The resulting holes have a diameter < 1 $\mu$m. A, B, C, and D indicate points where metallization lines cross over the top of the borophosphorsilicate glass insulation 14, irrespective of the irregular surface and topography of the BPSG layer.

Figure 2:
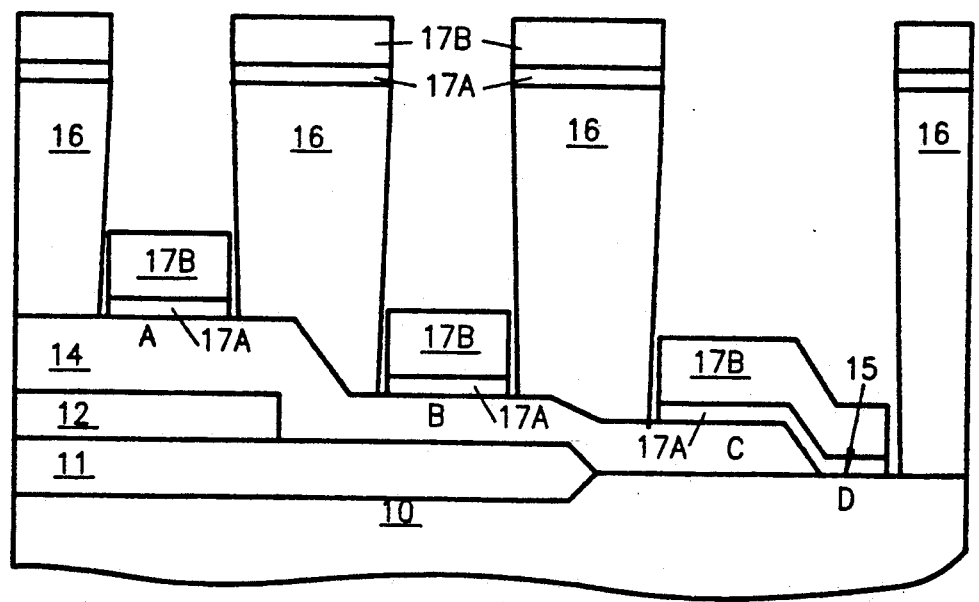
FIG. 2 is a cross-section of the left side of the device as shown in FIG. 1 with the lift-off resist mask, after deposition of the first metallization layer.

The next process step is the definition of the first-level interconnecting metallization pattern through a lift-off technique as illustrated in FIG. 2. The lift-off stencils 16 are first applied over the substrate 14, the metal film 17A and 17B is evaporated, and then the film on top of the stencils 16 is lifted-off. The film used for the first metallization consists of titanium 17A and an Al-Cu based alloy 17B with a thickness generally < about 1 $\mu$m, and preferably of about 0.6 $\mu$m. The metal pitch is < about 3 $\mu$m.

Next, the first layer 18 (FIG. 3) of a double-layer insulation, about 0.4 $\mu$m of plasma nitride, is deposited. Plasma nitride is a very conformal layer with similar thickness over all integrated circuit topographies. A photoresist layer 19 is then applied. Unlike nitride, the photoresist layer 19 is a planarizing rather than a conformal layer. The nominal thickness of this layer is about 1-2 $\mu$m. A photoresist which is suitable for this purpose is, for example, a positive resist formed from a soluble phenolic resin and a sensitizer which is a diester of a 1-oxo-2-diazonaphthalene sulfonic acid and of an unsymmetrical primary or secondary aliphatic diol which is a mixture of geometric and diastereoisomers (see U.S. Pat. No. 4,397,937).

Figure 3:
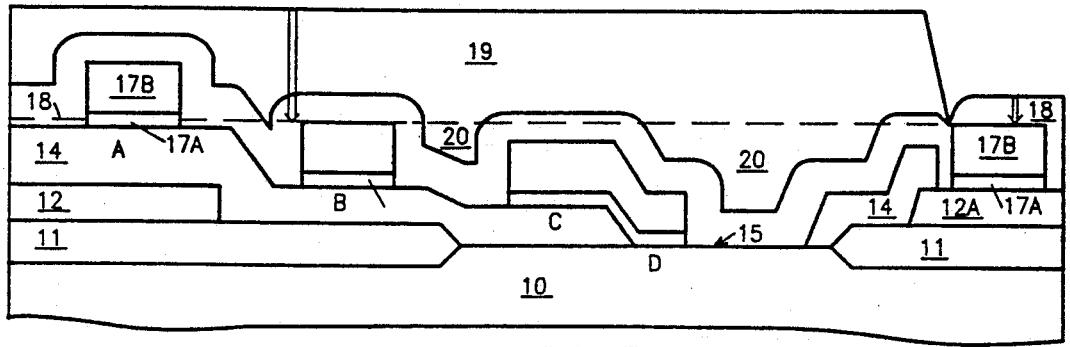
FIG. 3 is a similar cross-section of the same device after deposition of plasma nitride and planarizing resist over the first metallization pattern.

The photoresist layer 19 shown on the left side of FIG. 3 acts as a planarizing layer. The same layer also serves to define a pad mask by a photoprocess, e.g. of metal pad 17A and 17B over the polysilicon pad (12A). The metal pad 17A and 17B is used as a direct contact to the polysilicon pad 12A, and provides additional or alternate capability for connecting the various I/0 pads of the integrated circuits. On the right side of FIG. 3, this metal pad 17A and 17B, which is still covered by the silicon nitride layer 18, is shown.

Next, the photoresist layer 19 and the silicon nitride interlevel insulator layer 18 are etched down in an RIE process to the dotted line shown in FIG. 3 with a CF$_4$ etching gas at a flow rate of about 50 sccm/min. and a pressure of about 40 μbar. Under these conditions, the etch rate ratio of photoresist to silicon nitride is about 1:1. Concurrently with the planar etching of photoresist and silicon nitride, the silicon nitride 18 covering metal pad 17A and 17B is removed, and the metal pad 17A and 17B is opened. Finally, the remaining photoresist 20 is stripped with N-methylpyrrolidone or removed by ashing in an O$_2$-plasma. The described technology allows reducing the topology of the structure by about 0.5 μm. Its planarization properties greatly improve the second-metal wiring reliability.

Figure 3A:
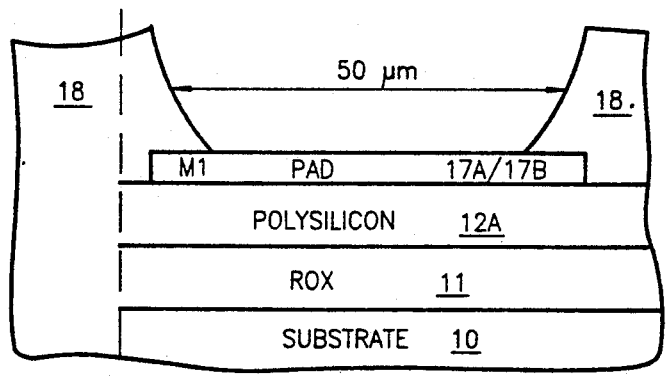
FIG. 3A is a cutout of the cross-section of FIG. 3 showing a pad which has been opened by a photoprocess.

FIG. 3A is a cutout of FIG. 3 and shows an opened metal pad 17A and 17B with a width of about 50 μm over the layer sequence comprising silicon substrate 10, recessed oxide (ROX) 11, and polysilicon 12A. Silicon nitride 18 on the left side of the pad opening, which covers the first metallization at points A, B, and C, has been planarized by reactive ion etching as described above.

Figure 4:
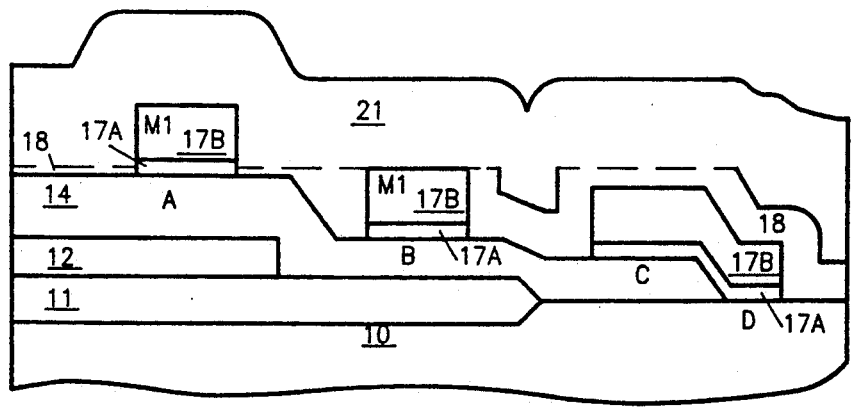
FIG. 4 is a similar cross-section of the device after planarization by RIE and deposition of silicon dioxide insulation.

Following the planarization step, the second layer 21 (FIG. 4) of a double-layer insulation, about 0.8 μm of plasma silicon dioxide, is deposited. For further improvement of planarity, this step may be followed by the spinning-on of a second photoresist layer and a second reactive ion etching step for the planarization of photoresist and oxide. To replace the oxide which is removed by etching, a second oxide layer, about 0.4 μm of plasma silicon dioxide, is deposited (not shown). This double deposition of silicon dioxide results in a further improvement of planarity and a decrease of ½ interlevel shorts.

Figure 5:
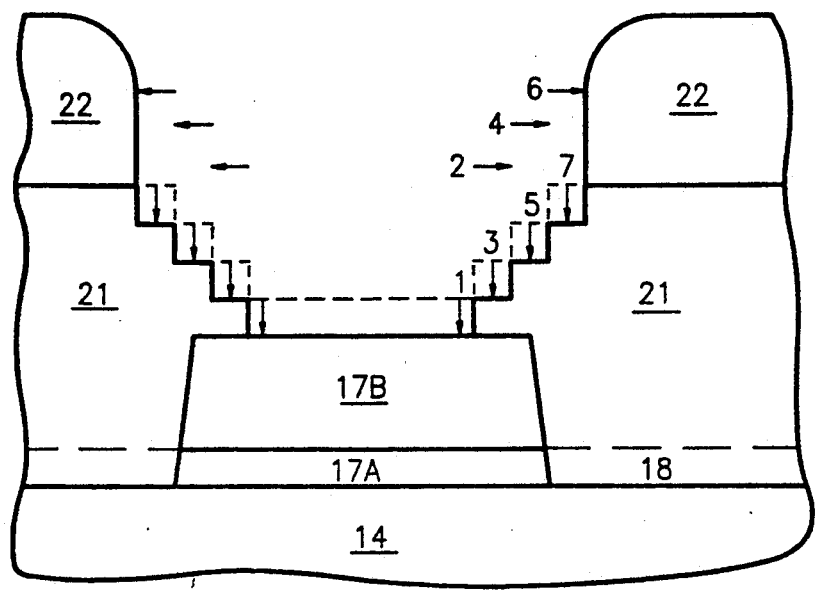
FIG. 5 illustrates the contour etching of silicon dioxide insulation to provide a via hole for interconnecting the first metallization pattern.

FIG. 5 shows the etching of a slope controlled via hole through silicon dioxide layer 21 in the direction of the first metallization 17A and 17B. To this end, a photoresist layer 22 is applied to silicon dioxide layer 21, and the photolithographically defined openings in the photoresist layer 22 are transferred into the silicon dioxide layer 21 in a series of process steps which includes etching the silicon dioxide combined with periodic photoresist removal steps. As shown in FIG. 5, via holes are etched into silicon dioxide layer 21 with CF$_4$. The next step consists of a lateral etching of the photoresist 22 in O$_2$. This step exposes more of the surface of the silicon dioxide layer 21. The silicon dioxide layer 21 is then etched once more, etc. yielding the stepped outline shown in FIG. 5. Finally, the remaining photoresist 22 is removed by O$_2$ ashing. Concurrently with the via etching, the metal pads 17A and 17B are opened again. The described etching process is particularly advantageous with respect to a satisfactory coverage of the second metal, especially when using a metal lift-off process, or in metal vapor deposition, e.g. of Ti-Al-Cu at room temperature.

Figure 6:
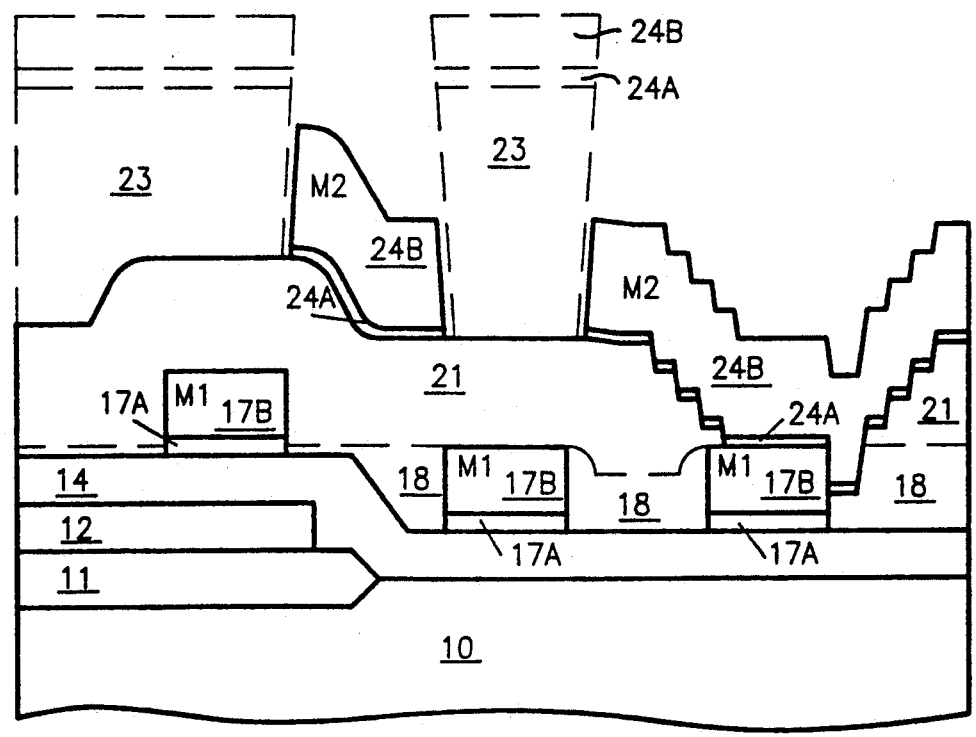
FIG. 6 is a similar cross-section of the device with lift-off resist mask after deposition of the second metallization layer.

The next process step is the definition of the second-level interconnecting metallization through the lift-off technique as illustrated in FIG. 6. The lift-off stencils 23 are first applied to the silicon dioxide layer 21, the metal film, Ti-Al-Cu 24A and 24B is evaporated to a thickness of about 1.0 μm, and then the film on top of the stencils 23 is lifted-off. The resulting metal pitch is <3 μm.

Figure 7:
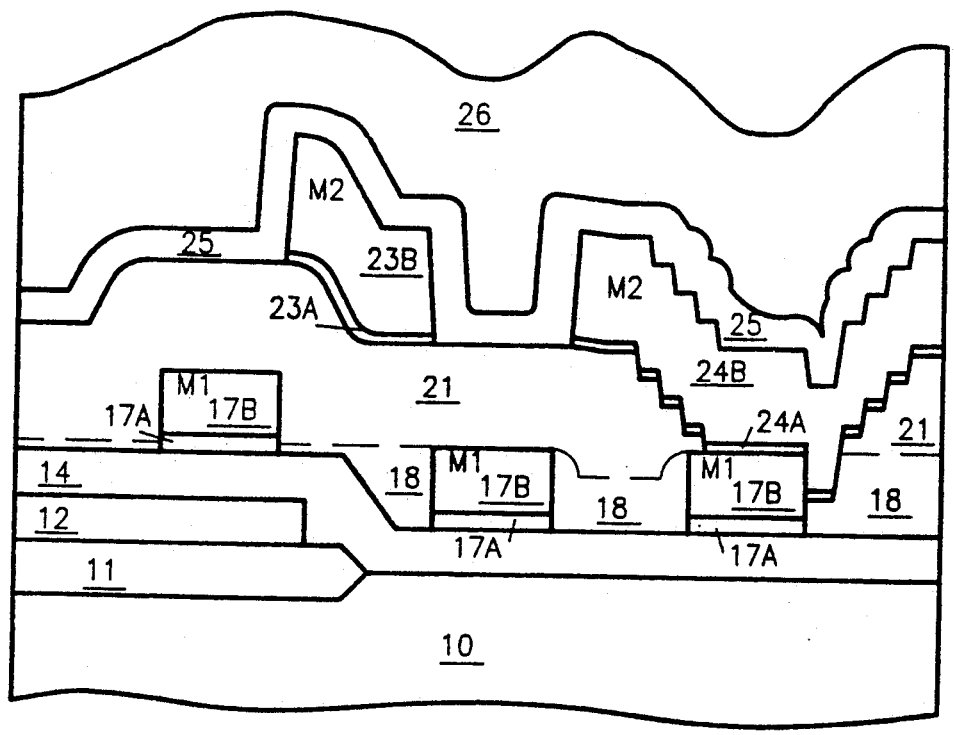
FIG. 7 is a similar cross-section of the device after deposition of plasma nitride and planarizing polyimide.
Figure 8:
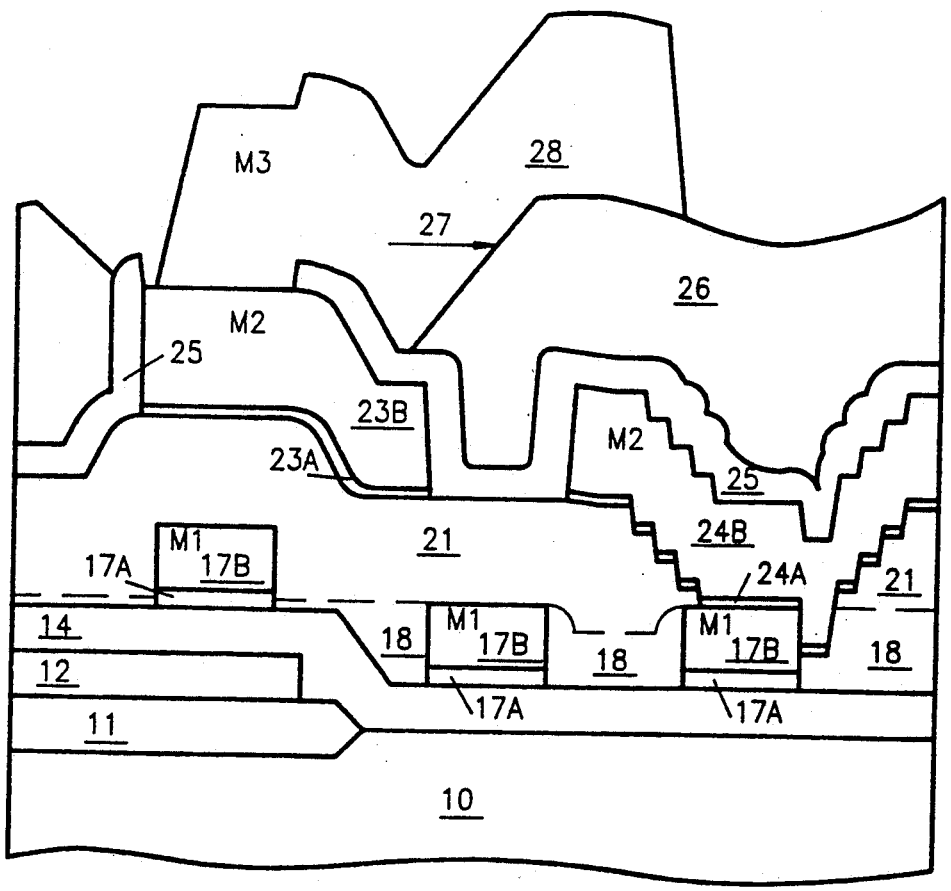
FIG. 8 is a similar cross-section of the device with via hole through polyimide and plasma nitride for interconnecting the second metallization pattern with the third (terminal) metallization pattern.

Following the definition of the second-level metallization, a double layer insulation 25 and 26 (FIG. 7) is applied. The lower layer 25 consists of about 0.4 μm silicon nitride and is applied by plasma deposition. The upper layer 26 consists of about 1.0 μm polyimide and is applied by spinning-on. This layer is a planarizing, rather than a conformal layer. Next, a via hole is etched through the double layer insulation 25 and 26. The via hole angle required for good metal coverage is about 70 degrees. The polyimide layer can be etched in a plurality of small steps, or, as described in European patent application EP-A-87105700.6 (0 286 708) and in O. Koblinger, et al., "*Postsloped Vias*", IBM Tech. Discl. Bull., Vol. 32, No. 8B (Jan. 1990), pp. 443–445, ⅔ to ¾ of the polyimide layer is etched through in one single step with a CF$_4$-based etching gas. The etching of polyimide and nitride is decoupled by an O$_2$-etching step. Subsequently, the nitride is etched stepwise with a CF$_4$-based etching gas, alternating with ashing steps in O$_2$. By a final O$_2$-RIE step, a bias 27 (FIG. 8) of 0.3 to 0.5 μm is etched into the polyimide 26. This bias ensures good coverage of the sloped via by the third metal 28.

Finally, the third (terminal) metallization 28 is applied. To this end, lift-off stencils are generated as previously described (not shown), and Ti—Al—Cu 28 is evaporated to a thickness of about 2.0 μm. The film on top of the stencils is lifted off.

While the invention has been particularly shown and described with reference to preferred embodiments thereof, it will be understood by those skilled in the art that various changes in form and details may be made therein without departing from the spirit and scope of the invention.

What is claimed is:

1. A method for providing a plurality of conductive metallization patterns separated by insulating layers on an integrated circuit, comprising the steps of:

applying a first metallization pattern to a semiconductor substrate having at least one integrated circuit;

applying a first layer of a first double-layer insulation on said first metallization pattern;

applying a photoresist layer on said first layer for planarizing the topology of said first metallization pattern and for defining a pad mask by a photoprocess in said photoresist layer;

reactive ion etching said photoresist layer and said first layer at substantially the same rate for planarizing the underlying topology and for removing said first layer from the pad mask area, thereby exposing said first metallization pattern in said pad mask area over a conductive pad;

applying a second layer of said first double-layer insulation on said planarized topology;

masking said second layer and opening vias in said second layer in predetermined areas by a plurality of dry-etching steps;

applying a second metallization pattern to said second layer;

applying a second double-layer insulation comprising an inorganic dielectric layer and an organic dielectric layer on said second metallization pattern;

masking said second double-layer insulation and opening vias in said dielectric layers thereof in predetermined areas by a plurality of dry-etching steps; and applying a third metallization pattern to said second double-layer insulation.

2. The method of claim 1, wherein, prior to the deposition of said first metallization pattern, contact holes to active regions in the substrate are defined in a borophosphorsilicate glass layer overlying said substrate by a photoprocess and reactive ion etching steps.

3. The method of claim 1, wherein said first and second metallization patterns are applied by a lift-off technique.

4. The method of claim 1, wherein said third metallization pattern is applied by a lift-off technique or by evaporation.

5. The method of claim 1, wherein said first, second and third metallization patterns comprise layers of titanium and of an aluminium-copper based alloy.

6. The method of claim 5, wherein:
said first metallization pattern has a thickness of about 0.6 μm and a metal pitch < about 3 μm; said second metallization pattern has a thickness of about 1.0 μm and a metal pitch < about 3 μm; and said third metallization pattern has a thickness of about 2.0 μm and a metal pitch < about 3 μm.

7. The method of claim 1, wherein said first layer of said double-layer insulation is a silicon nitride layer which is conformal with all wafer topographies, and which is applied by plasma deposition with a thickness of about 0.4 μm.

8. The method of claim 7, wherein said photoresist layer comprises a positive photoresist and is applied to said silicon nitride layer with a thickness of about 1–2 μm.

9. The method of claim 8, wherein a pad mask is defined by a photoprocess in said photoresist layer and developed, and said photoresist layer and said silicon nitride layer are then reactive ion etched to a predetermined depth at an etch rate ratio of about 1:1 in a $CF_4$ etch gas at a flow rate of about 50 sccm/min. and at a pressure of about 40 μbar.

10. The method of claim 1, wherein said second layer of said double-layer insulation is a silicon dioxide layer which is applied by plasma deposition with a thickness of about 0.8 μm.

11. The method of claim 10, wherein, for further improvement of planarity, a second photoresist layer is applied to said silicon dioxide layer, said second photoresist layer and the underlying silicon dioxide layer are etched in a second reactive ion etching step to a predetermined depth, and the etched-off silicon dioxide is replaced by depositing a second silicon dioxide layer of corresponding thickness.

12. The method of claim 11, wherein a photoresist mask for via holes is defined in said second photoresist layer, and said via holes are etched with $CF_4$ into said silicon dioxide layer by a plurality of etching steps, combined with lateral photoresist removal steps with $O_2$.

13. The method of claim 1, wherein a second metallization pattern is applied to said second layer, and said second double-layer insulation is then applied to said second metallization pattern; and wherein said second double-layer insulation comprises a plasma deposited silicon nitride layer with a thickness of about 0.4 μm and a spun-on polyimide layer with a thickness of about 1.0 μm.

14. The method of claim 13, wherein a photoresist mask for via holes is defined, and said via holes are etched through said second double-layer insulation, said polyimide layer being etched through in one single step with $CF_4$, followed by an $O_2$-etching step, and said silicon nitride layer being etched in a plurality of etching steps with $CF_4$, combined with lateral photoresist and polyimide removal steps in $O_2$.

15. A multilayer integrated circuit structure, comprising:
a substrate;
a plurality of devices formed on said substrate;
a first metallization pattern for interconnecting said devices;
at least one electrical contact between a predetermined region of said first metallization pattern and a semiconductor region of at least one of said devices on said substrate; said contact being formed in a corresponding contract hole in an insulating dielectric layer underlying said first metallization pattern;
a first double-layer insulation comprising two inorganic dielectric layers on said first metallization pattern, where the top surface of said double-layer insulation is substantially planar;
a second metallization pattern;
at least one electrical contact between a predetermined region of said second metallization pattern and a corresponding region of said first metallization pattern, said contact being formed in a corresponding via hole in said double-layer insulation;
a second double-layer insulation comprising an inorganic dielectric layer and an organic dielectric layer;
a third metallization pattern; and
at least one electrical contact between a predetermined region of said third metallization pattern and a corresponding region of said second metallization pattern, said contact being formed in a corresponding via hole in said double-layer insulation.

16. The integrated circuit structure of claim 15, wherein:
said first, second and third metallization patterns comprise layers of titanium and of an aluminium-copper based alloy; said first metallization pattern has a thickness of about 0.6 μm and a metal pitch < about 3 μm; said second metallization pattern has a thickness of about 1.0 μm and a metal pitch < about 3 μm; and said third metallization pattern has a thickness of about 2.0 μm and a metal pitch > about 3 μm.

17. The integrated circuit structure of claim 16, wherein said first dielectric layer of said first double-layer insulation is a silicon nitride layer with a thickness of about 0.4 μm, and said second dielectric layer is a silicon dioxide layer with a thickness of about 0.8 μm.

18. The integrated circuit structure of claim 17, wherein said first dielectric layer of said second double-layer insulation is a silicon nitride layer with a thickness of about 0.4 μm, and said second dielectric layer is a polyimide layer with a thickness of about 1.0 μm.

19. The integrated circuit structure of claim 18, wherein said via holes through said first and second double-layer insulations are sloped via holes made by contour-etching.

* * * * *